(12) United States Patent
Shah et al.

(10) Patent No.: US 7,895,551 B2
(45) Date of Patent: Feb. 22, 2011

(54) GENERATION OF STANDARD CELL LIBRARY COMPONENTS WITH INCREASED SIGNAL ROUTING RESOURCES

(75) Inventors: Dharin Shah, Bangalore (IN); Clive David Bittlestone, Allen, TX (US); Graham McLeod Barr, Allen, TX (US); Girishankar Gurumurthy, Bangalore (IN); Pavan Vithal Torvi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 148 days.

(21) Appl. No.: 12/124,162

(22) Filed: May 21, 2008

(65) Prior Publication Data

US 2009/0293023 A1 Nov. 26, 2009

(51) Int. Cl.
G06F 17/50 (2006.01)

(52) U.S. Cl. ...................................... 716/100

(58) Field of Classification Search ............... 716/1, 716/6, 100
See application file for complete search history.

(56) References Cited

U.S. PATENT DOCUMENTS

2008/0092090 A1* 4/2008 Miyahara et al. ............... 716/2

* cited by examiner

*Primary Examiner*—Jack Chiang
*Assistant Examiner*—Suchin Parihar
(74) *Attorney, Agent, or Firm*—John R. Pessetto; W. James Brady; Frederick J. Telecky, Jr.

(57) ABSTRACT

Generating cells with increased signal routing resources. In an embodiment, power and ground buses in a metal layer of a source cell are identified and removed. Any vias terminating on the removed buses may also be removed. Additional via and connections are added to other desired layers to provide connectivity to the nodes disconnected due to the earlier removal. According to an aspect of the present invention, such connections are added during a chip design phase (i.e., when the cell instances are incorporated into an integrated circuit, sought to be designed).

12 Claims, 8 Drawing Sheets

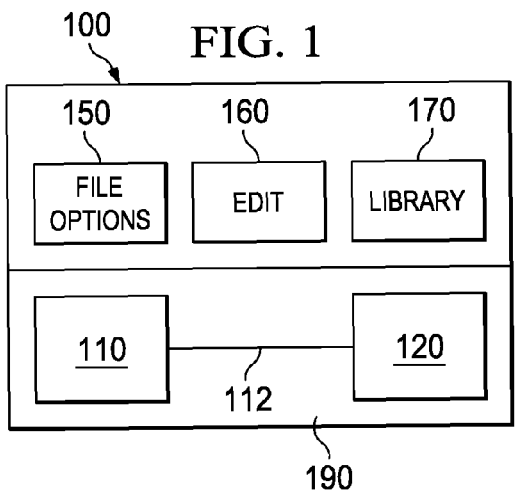
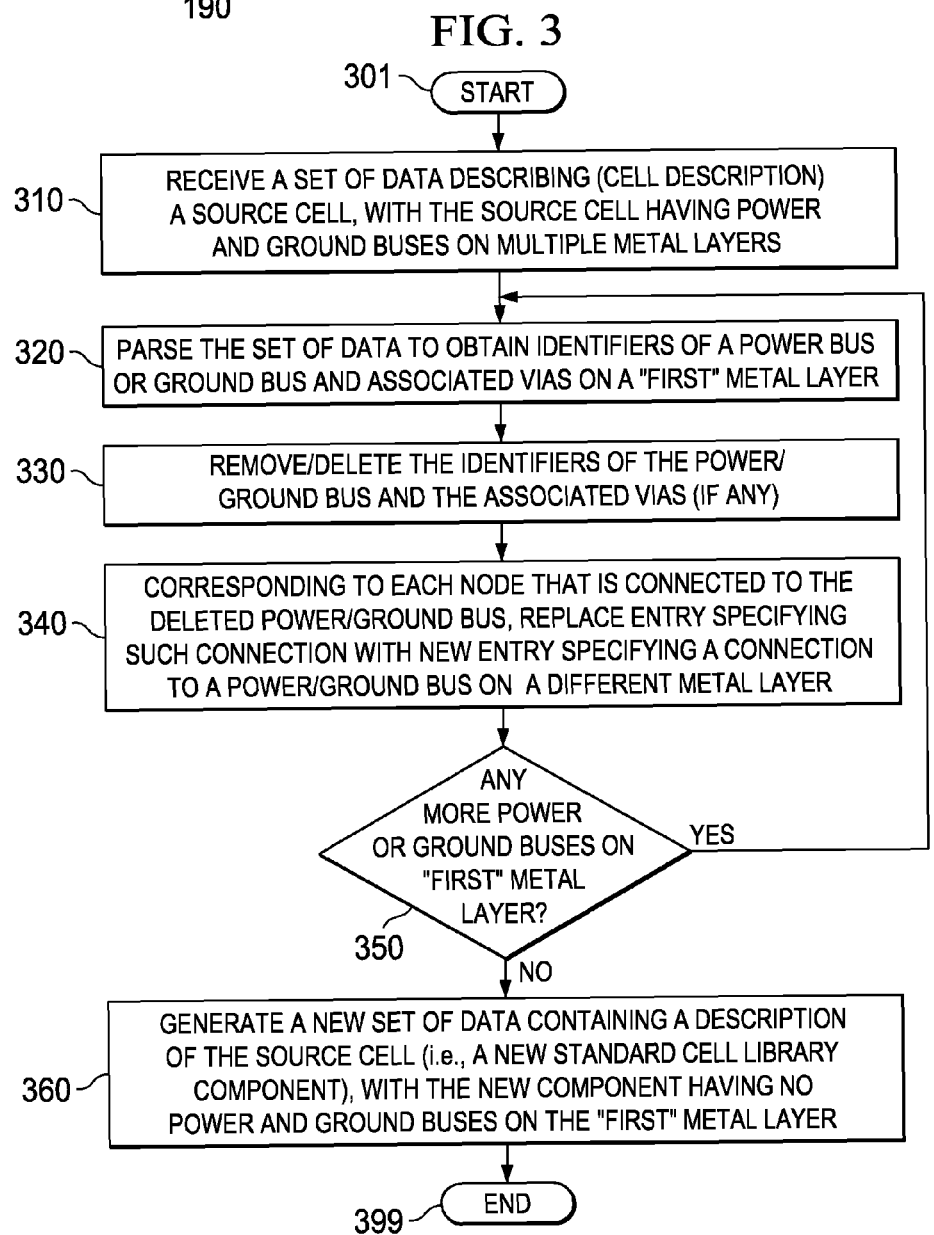

GENERATION OF STANDARD CELL LIBRARY COMPONENTS WITH INCREASED SIGNAL ROUTING RESOURCES

COPYRIGHT NOTICE

A portion of the disclosure of this patent document contains material which is subject to copyright protection. The copyright owner, Texas Instruments Incorporated, has no objection to the facsimile reproduction by anyone of the patent document or the patent disclosure, as it appears in the Patent and Trademark Office patent file or records, but otherwise reserves all copyright rights whatsoever.

BACKGROUND

1. Field of the Technical Disclosure

The present disclosure relates generally to computer aided design (CAD) of integrated circuit (IC), and more specifically to techniques for generating standard cell library components which have increased signal routing resources.

2. Related Art

With respect to IC design, a standard cell generally refers to a circuit containing semiconductor devices (for example, transistors, resistor, capacitor, etc.) which are interconnected, and perform a desired operation. For example, a set of interconnected transistors that performs a NAND logical operation on a set of inputs may be termed a NAND standard cell. Standard cells are typically building blocks (typically represented at the gate level) using which more complex circuits may be realized.

Descriptions of a standard cell in terms of both the logical operation as well as physical structure (layout on semiconductor, interconnections etc) are often provided in "soft" form, for example, as a set of data items in a file (as opposed to the hardware, which represents a corresponding realization in an integrated circuit). A standard cell library refers to a repository storing such descriptions, and each of such descriptions is often termed a component (the terms cell and component are used interchangeably in some instances in this document).

A designer may select a component from a standard cell library, and connect several (typically large number) of such components to realize a more complex circuit. As an example, a designer using electronic design automation (EDA) tools for designing an IC may select components stored in a standard cell library, interconnect the components using a schematic editor, simulate the functional behavior of the IC, and generate a set of data that can be provided to a foundry for fabricating the IC.

As is well known in the relevant arts, a standard cell may include one or more metal layers used to provide both power/ground connections to devices (e.g., transistors) in the standard cell, as well as to provide interconnections between the (terminals of) devices in the cell, and between two or more standard cells. Interconnections (connecting paths) between two or more standard cells (for example, to connect the output(s) of one cell to the input(s) of another cell) are referred to as signal routes.

One desirable feature during signal routing (determination of the shape, dimensions, placement etc., of connecting paths between cells) is increased availability of signal routing resources. Signal routing resources refer to area on the metal layers that is available for the interconnections to carry signals (as opposed to power/ground connections and connections internal to the cell) between two or more standard cells. At least in portions of an IC containing a substantial number of closely clustered and small sized (small implementation area) components, it may be desirable to use standard cell components in which more metal layer area is available for signal routing.

Several aspects of the present invention enable generating standard cell components with increased signal routing resources.

BRIEF DESCRIPTION OF THE DRAWINGS

The present invention will be described with reference to the following accompanying drawings, which are described briefly below.

FIG. 1 is a block diagram illustrating an example environment in which a designer/user may access a standard cell library component generated according to one or more aspects of the present invention.

FIG. 3 is a flowchart illustrating the manner in which standard cell components with increased signal routing resources are generated in an embodiment of the present invention.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

Overview

Figure 2A:
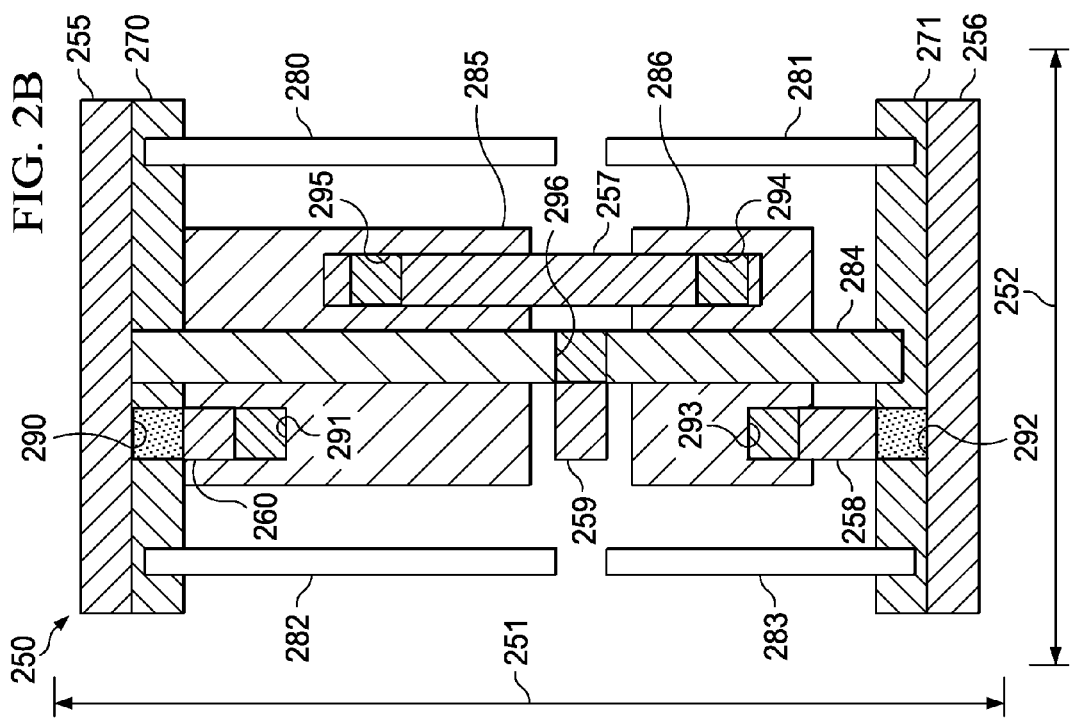
FIGS. 2A and 2B are diagrams illustrating the physical structure of respective example standard cells in an embodiment.

An aspect of the present invention generates cells with increased signal routing resources. In an embodiment, a cell description of a source cell is examined to identify a first power bus in a metal layer. The first power bus and the set of vias terminating on the first power bus are then removed from the cell description, and each of a set of nodes are connected to a respective power bus on a different metal layer, wherein the set of nodes are connected to the first power bus in the (source) cell description.

In an embodiment, the connections are made by a electronic design automation (EDA) tool, which integrates the modified cell description into other components (circuits, impedances, building blocks, etc.) as a part of an integrated circuit.

According to another aspect of the present invention, the same approach is followed with respect to ground buses as well, to further increase the signal routing resources. In general, the ground bus and power bus are termed as constant bias buses since the power and ground terminals can be viewed as constant bias terminals.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. User Experience

FIG. 1 is a block diagram illustrating an example environment in which a designer/user may access a standard cell library component (referred to below simply as component) generated according to one or more aspects of the present invention. The diagram shows a visual interface 100 (for example, on a computer monitor) using which a user may create and verify a circuit/IC. Visual interface 100 may be provided, for example, by an EDA tool (e.g., those available from Cadence Corporation, Mentor Graphics, etc. which enable an integrated circuit to be designed).

The display area provided by visual interface 100 is shown containing a "menu" area containing buttons "File Options" 150, "Edit" 160 and "Library" 170. File options 150 permits a user to create, open and store files containing the design of a circuit/IC. Edit 160 permits a user to edit the contents of a file, for example, graphically entering a schematic diagram of a circuit to be designed. Library 170 permits a user to retrieve components stored in one or more libraries (on a PC or workstation executing the EDA tool, or from an external device connected via a network). Typically, many more user options may be present, and only a few representative features of visual interface 100 are shown in FIG. 1 for conciseness.

As is well known in the relevant arts, a user creates a schematic of a circuit/IC by invoking instances of components from library 170, and connecting various nodes in the components in a desired manner to implement desired operations. For example, as shown in FIG. 1, a user may invoke an instance each of component 110 and component 120, and connect an output terminal of component 110 to an input terminal of component 120 by a wire 112.

Library 170 may contain a description of components 110 and 120. As noted above, the description(s) may include logic level descriptions (e.g., truth table, Boolean equations, etc.), as well as physical level descriptions.

A physical level description of a standard cell generally refers to the structure (layout on semiconductor, number of layers, interconnections, etc.) of the standard cell. Various aspects of the present invention provide cells with increased routing resources. The features may be understood by appreciating the structure of a standard cell and accordingly the description is continued with an example cell structure.

3. Example Standard Cell Structure

FIG. 2A is a diagram illustrating the physical structure of an example standard cell in one embodiment. Standard cell 200 represents an example inverter (NOT) standard cell (performing a NOT operation), and may be contained in library 170 (FIG. 1) in the form of a corresponding description(s). Standard cell 200 is shown having a cell height indicated by 201, and a cell width indicated by 202.

Portions 205, 206, 207, 208, 209 and 210 represent connections on metal layer 1. Portions 220 and 221 represent connections on metal layer 2. Portions 230, 231, 232 and 233 represent dummy poly (polycrystalline silicon) at the boundaries of standard cell 200 used for lithographic support.

Portions 235 and 236 represent transistor active PMOS and active NMOS regions respectively. Portion 234 represents poly used to form the gate terminal of the transistor.

In particular, in the embodiment illustrated in FIG. 2A, each of portions 205 and 220 (in metal layer 1 and metal layer 2 respectively) is used to provide power connections (for example, from a pad/pin on an IC incorporating cell 200) to the corresponding nodes in the cell. Accordingly, each of portions 205 and 220 is termed as a power bus. Portion 240 represents a via used to connect portion 205 with portion 220, i.e., to connect power bus in metal layer 1 to power bus in metal layer 2.

Each of portions 206 and 221 (in metal layer 1 and metal layer 2 respectively) is used to provide ground connections (for example, from a pad/pin on an IC incorporating cell 200) to the corresponding nodes in the cell. Portion 242 represents a via used to connect portion 206 with portion 221, i.e., to connect ground bus in metal layer 1 to ground bus in metal layer 2. Accordingly, each of portions 206 and 221 is termed as a ground bus. Each of power bus and ground bus may be at least logically viewed as representing a bus connecting to a power supply (not shown).

As is well known, a via is a through-hole used to connect a portion in one layer to a portion in another layer. Vias 240 and 242 are shown terminating on portions 220 and 221 respectively. In general, each via generally provides a conductive path between two layers and is termed as terminating on each of these layers. Portions 241, 243, 244, 245 and 246 represent vias used to connect the corresponding portions as shown in FIG. 2A.

It may be appreciated that power and ground connections are provided in metal layer 2 (portions 220 and 221 respectively) as well as in metal layer 1 (portions 205 and 206 respectively). Standard cell 200, therefore has what is termed a metal1-metal2 sandwich architecture. However, the provision of power and ground connections in metal layer 2 reduces the area available on metal layer 2 for signal routing.

Figure 2B:
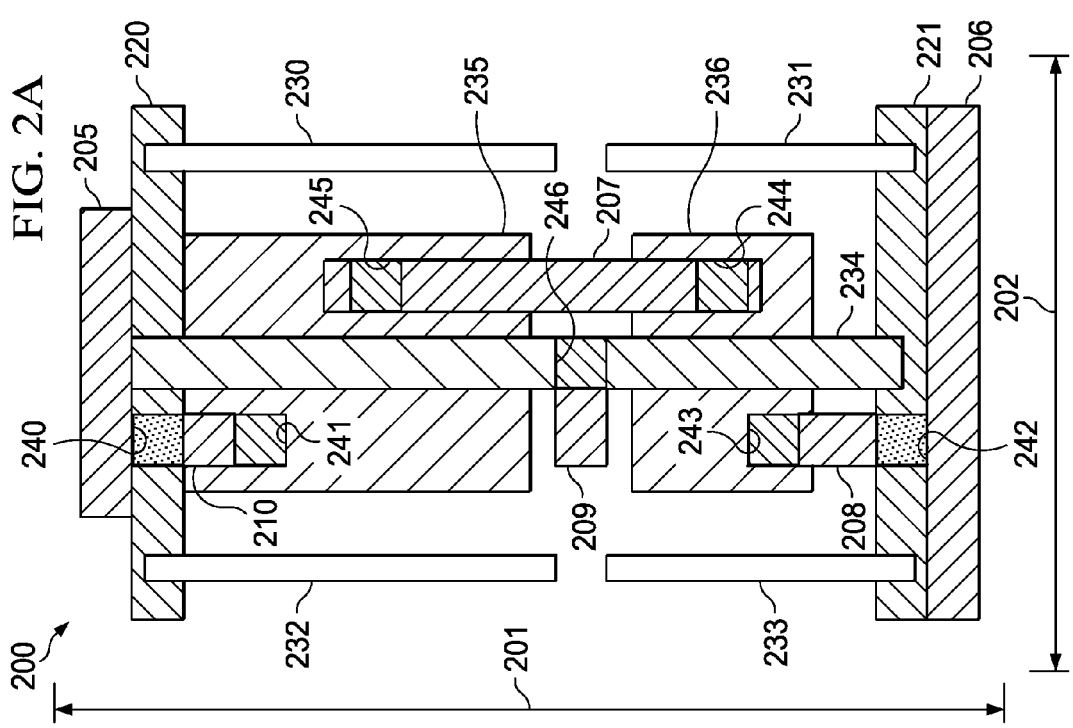

FIG. 2B shows another structure of an inverter (NOT) standard cell 250 that (whose description/s) may be contained in library 170. Portions 256, 257, 258, 259, 260, 270, 271, 280, 281, 282, 283, 284, 285 and 286 of standard cell 250 correspond (same as) respectively to portions 206, 207, 208, 209, 210, 220, 221, 230, 231, 232, 233, 234, 235 and 236. Vias 290, 291, 292, 293, 294, 295 and 296 correspond respectively to vias 240, 241, 242, 243, 244, 245 and 246. Power bus 255 on metal layer 1 is wider than the corresponding power bus 205 in standard cell 200. With respect to standard cell 250 also the provision of power and ground connections in metal layer 2 reduces the area available on metal layer 2 for signal routing.

Several (e.g., thousands) of such cells similar to standard cell 200/250 may be used in creating an IC. The reduced area available in one or more metal layers in such cells for signal routing (connecting signals between cells) noted with respect to the standard cells in the description above may render the signal routing operation complicated.

At least for such a reason, it may be desirable that library 170 contain standard cell components with structures that lend greater routing resources (in terms of area available) for signal routing, for example by eliminating power and ground buses from a layer such as metal layer 2. Further, it may be desirable that such elimination be done without requiring substantial rework involving, for example, redesign/re-characterization etc. of the cells.

Several aspects of the present invention enable generation of standard cell components with increased signal routing resources, without requiring such a substantial rework, as described next with respect to a flowchart.

4. Generation of Modified Standard Cell Component

FIG. 3 is a flowchart illustrating the manner in which modified standard cell components with increased signal routing resources are generated in an embodiment of the present invention. The flowchart is described with respect to FIGS. 2A and 2B, and in relation to the environment of FIG. 1, merely for illustration. However, various features can be implemented in other environments. Furthermore, the steps are described in a specific sequence merely for illustration.

Alternative embodiments in other environments, using other components and different sequence of steps can also be implemented without departing from the scope and spirit of several aspects of the present invention, as will be apparent to one skilled in the relevant arts by reading the disclosure provided herein. The flowchart starts in step 301, in which control passes immediately to step 310.

In step 310, a set of data describing (containing a description of) a (source) standard cell is received, with the source cell having power and ground buses on multiple metal layers. The set of data may contain identifiers identifying each portion (for example nodes of devices/transistors in the source cell, layer information, interconnecting paths in the cell, etc.) of the source cell. In an embodiment, the set of data (cell description) is received in LAFF (LISP Archivable File Format), the information related to which can be obtained from Texas Instrument Incorporated) format, well known in the relevant arts to describe layout information. Control then passes to step 320.

In step 320, the set of data is parsed to obtain identifiers of a power bus or ground bus (fixed bias bus) and associated vias on a "first" metal layer. The "first" metal layer may correspond to any metal layer in the source cell. In an embodiment, the "first" metal layer corresponds to metal layer 2. While parsing represents a typical examination operation in software based systems, it should be appreciated that other examination techniques using a desired combination of hardware/software and firmware can be employed in alternative embodiments. Control then passes to step 330.

In step 330, the identifiers of the power/ground bus are deleted/removed from the set of data. In addition, identifiers of all vias in the cell that connect to the deleted power/ground bus may also be deleted. It should be appreciated that the deletion of the constant bias buses would disconnect some of the nodes of the cell. Control then passes to step 340.

In step 340, entries (or identifiers) specifying connections between portions or nodes in the source cell and the deleted power/ground bus are respectively replaced with corresponding new entries specifying connections instead to a power/ground bus on a different (other than the "first") metal layer. In one embodiment, the data resulting from step 330 is stored as modified description of the standard cell (or the modified standard cell). When the modified cell is used in the integrated circuit design phase (for example, as in FIG. 1), the design tool may be used to connect the previously disconnected nodes to desired power buses. Control then passes to step 350.

In step 350, it is determined if more power/ground buses are present on the "first" metal layer. If more power/ground buses are not present on the first metal layer, control passes to step 360, else control passes to step 320, and steps 320 through 350 may be repeated.

In step 360, a new set of data containing a description of the modified cell (i.e., a new standard cell library component or a new description) is generated, with the new component having no power and ground buses on the "first" metal layer. The new description (new component) may be added to library 170. Control then passes to step 399, in which the flowchart ends.

From the above, it may be appreciated that power and ground bus connections are connected on layers other than the "first" layer. Thus, the "first" layer would be available for signal routing (i.e., to interconnect various cell outputs and inputs) when the standard cell formed by FIG. 3 is later used in the design of integrated circuits.

In an embodiment the "first" layer of above corresponds to metal layer 2. As is well known, when fabricating an integrated circuit, multiple layers of metals are used in a sequence (with other layers potentially in between) and the layers are numbered 1-N, wherein metal layer 1 is the first layer to be laid and metal layer N is the last layer.

Thus, due to the operation of the flowchart of FIG. 3, power/ground buses are eliminated from the "first" metal layer (e.g., metal layer 2). Therefore, the new component (new cell) has more area on the "first" metal layer for routing signals. The new component may be stored in library 170, and a user may use the new component, for example, in portions of an IC where a substantial number of closely clustered and small sized standard cells are present.

The structures of standard cells generated from standard cells 200 and 250 (illustrated in FIGS. 2A and 2B) according to the procedure described above are described next.

5. Standard Cell Component with Increased Routing Resources

Figure 4B:
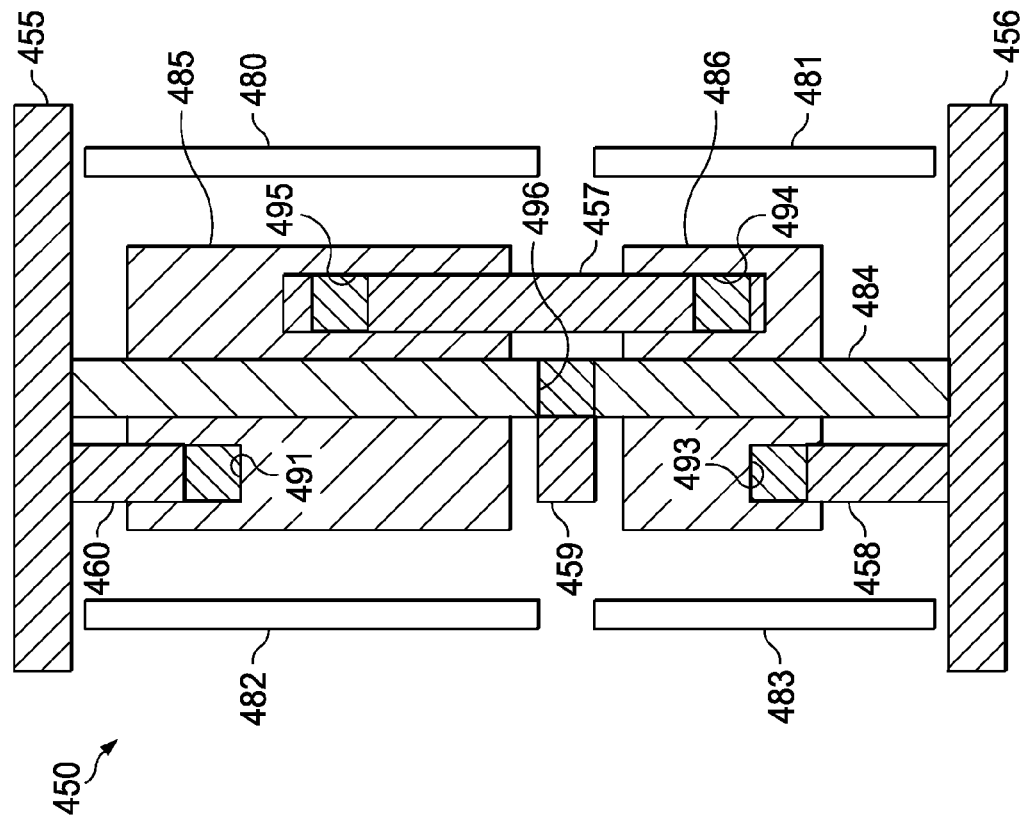
FIGS. 4A and 4B are diagrams illustrating the physical structures of example standard cells generated according to several aspects of the present invention.
Figure 4A:
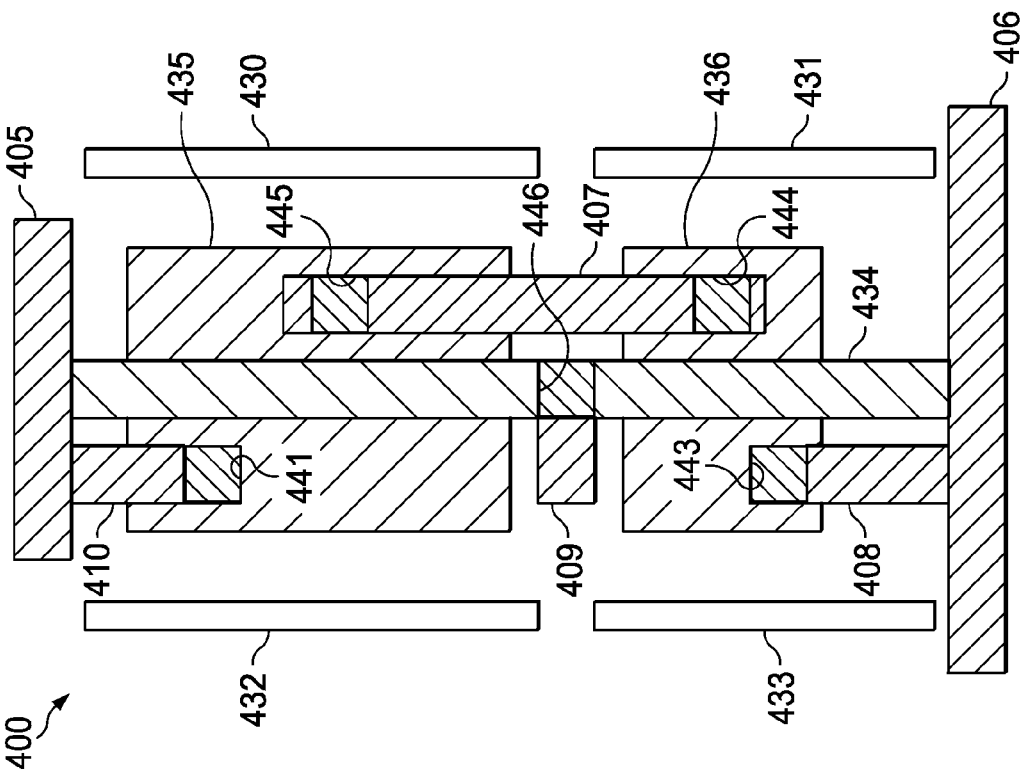

FIG. 4A is a diagram illustrating the physical structure of an example standard cell 400 generated from standard cell 200 according to several aspects of the present invention.

Thus, in accordance with the flowchart of FIG. 3, power bus 220 and ground bus 221 are first identified as being on metal layer 2 (assuming metal layer 2 corresponds to the "first" layer"). Any of the vias that terminate at the identified buses are then determined. Thus, via 240 (terminating on power 220) and via 242 (terminating on ground bus 221) are determined.

Power bus 220, ground bus 221, and the two vias 240 and 242 are removed from the cell description. Connections to power/ground was earlier provided through metal layer 2 (220, 221 respectively) may now be provided by metal layer 1 (205, 206 respectively.) during the later chip design phase, as noted above.

The new cell formed by the removal of the metal layer 2 and corresponding vias from the cell of FIG. 2A is depicted in FIG. 4A. For conciseness, FIG. 4A is described in comparison to the circuit of FIG. 2A. Portions 405, 406, 407, 408, 409, 410, 430, 431, 432, 433, 434, 435 and 436 of standard cell 400 correspond respectively to (or are same as) portions 205, 206, 207, 208, 209, 210, 230, 231, 232, 233, 234, 235 and 236 of standard cell 200. Vias 441, 443, 444, 445 and 446 correspond respectively to vias 241, 243, 244, 245 and 246.

It may be observed from FIG. 4A that power bus 220 and ground bus 221 present in metal layer 2 of standard cell 200 (FIG. 2A) are not present in standard cell 400. Associated vias 240 and 242 in standard cell 200 are not present either in standard cell 400. Thus metal layer 2 of standard cell 400 may be fully utilized for routing signals.

FIG. 4B is a diagram illustrating the physical structure of an example standard cell 450 generated from standard cell 250. Briefly, power buses 270, ground 271 and vias 290/292 are removed as described above.

Portions 455, 456, 457, 458, 459, 460, 480, 481, 482, 483, 484, 485 and 486 of standard cell 450 correspond (same as) respectively to 255, 256, 257, 258, 259, 260, 280, 281, 282, 283, 284, 285 and 286 of standard cell 250. Vias 491, 493, 494, 495 and 496 correspond respectively to vias 241, 243, 244, 245 and 246.

It may be observed from FIG. 4B that power bus 270 and ground bus 271 present in metal layer 2 of standard cell 250 (FIG. 2A) are not present in standard cell 450. Associated vias 290 and 292 in standard cell 250 are not present either in standard cell 450. Thus metal layer 2 of standard cell 450 may be fully utilized for routing signals.

Further, since the power and ground buses in metal layer 1 are respectively parallel to the power and ground buses in metal layer 2 in a source cell (such as cells 200 and 250), removal of the power and ground buses in metal layer 2 (as described above) may not change electrical connectivity to power/ground.

Hence, the behavior (performance characteristics) of the source cell and the corresponding generated cell are substantially the same, i.e., the removal of power-ground bus in metal layer 2 does not introduce any change in electrical characterization values.

Therefore, it may be appreciated that the manner in which an existing (source) standard cell is modified to provide another (new description of) standard cell according to the techniques described above does not require the new standard cell to be re-characterized.

Thus, the generation of new components from existing ones may be performed without requiring undue effort or time.

It may be appreciated that (corresponding to step 340 of the flowchart of FIG. 3) nodes connected to metal 2 layer (power or ground) before modification of the standard cell may (after modification of the standard cell) require to be provided connections (reconnections) to power or ground on metal layer 1 (or any metal layer power/ground in general). In an embodiment of the present invention, such connections are provided when the modified standard cells (such as standard cells 400 and 450 of FIGS. 4A and 4B respectively) are interconnected during the process of designing a chip (i.e., at chip level design), as illustrated next with respect to FIGS. 5A and 5B.

6. Reconnections Provided at Chip Level

Figure 5A:
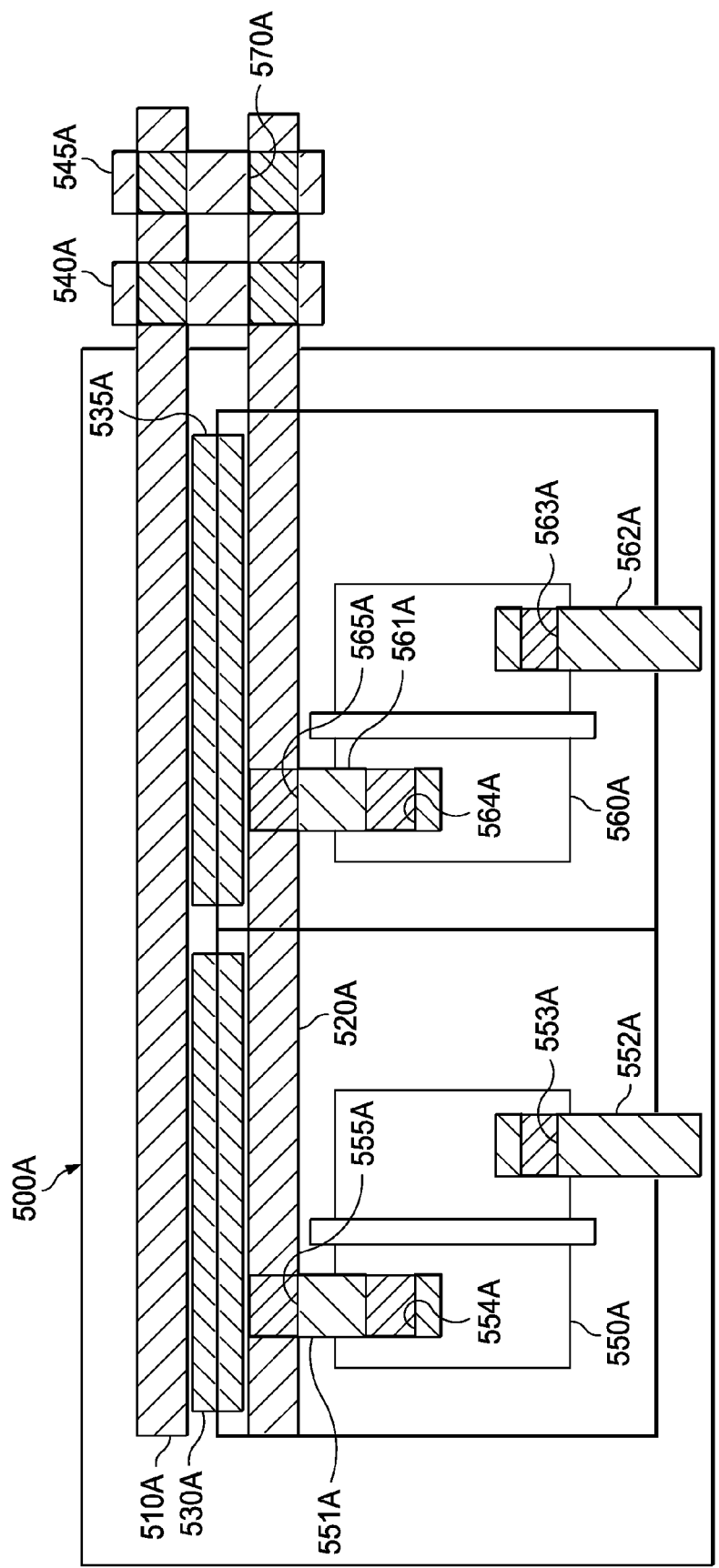
FIGS. 5A and 5B are diagrams used to illustrate the manner in which reconnections to portions of a modified standard cell are provided at chip design stage in an embodiment of the present invention.
Figure 5B:
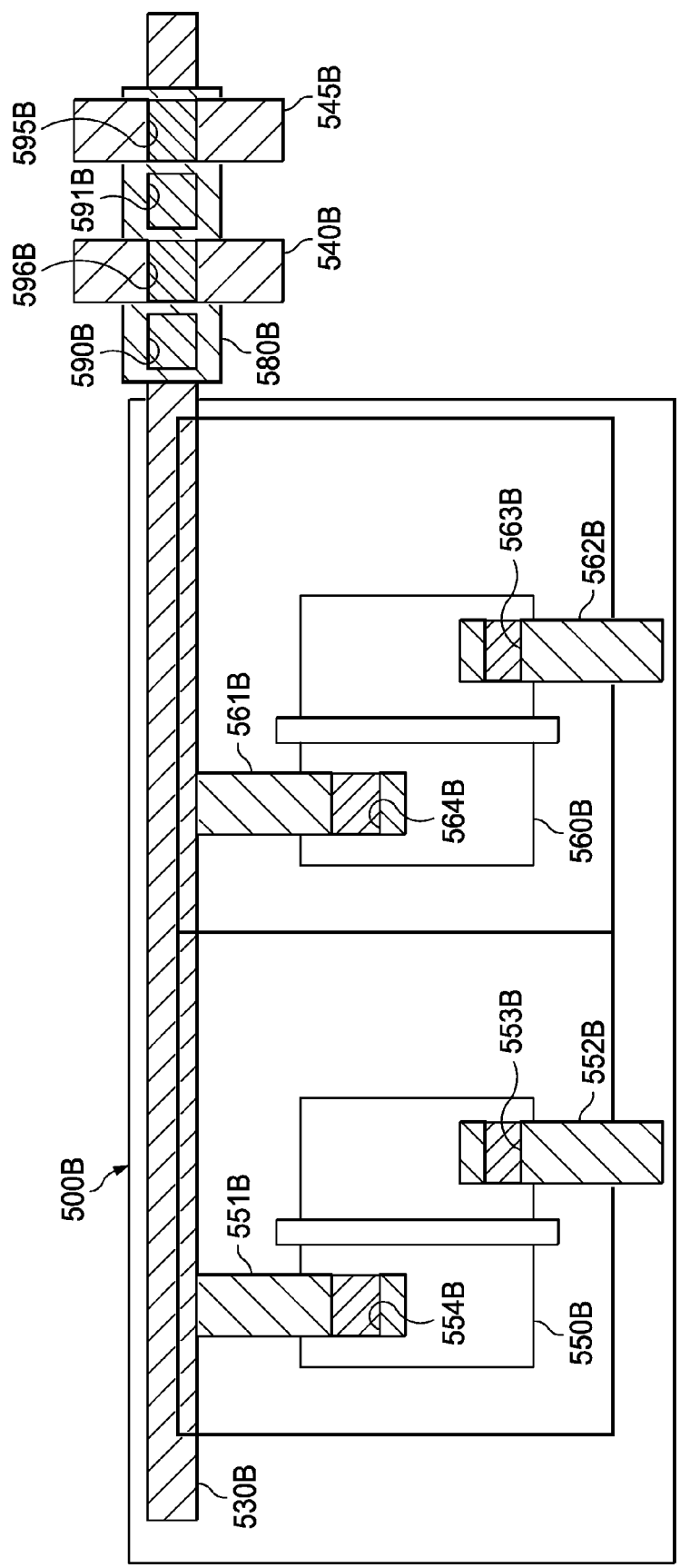

FIGS. 5A and 5B are example diagrams provided to illustrate the manner in which reconnections are provided at chip level (chip design stage) in an embodiment of the present invention. FIG. 5A is shown containing a standard cell 500A, while FIG. 5B is shown containing a modified standard cell 500B (generated according to the flow chart of FIG. 3), with the reconnections provided at chip level, as described below.

Standard cell 500A is shown containing portions 550A and 560A which may correspond to a node or terminal of an electronic component such as transistor, diode etc. Portions 510A and 520A correspond to power bus on metal layer 2. Portions 530A, 535A, 551A, and 561A correspond to metal layer 1 connections. Portions 554A, 553A, 564A and 563A represent contacts between corresponding portions of metal layer 1 and portions 550A and 560A, as may be observed from FIG. 5A. Portions 552A and 562A respectively may be used to connect portions 550A and 560A (through contacts 553A and 563A) to other nodes/terminals, not shown. Portions 540A and 545A represent metal layer 3 provided at the chip level (in the process of integrating standard cell 500A with other cells/components to design/create an IC/chip).

In the example standard cell 500A, power connections to the various portions are provided as described next. Power connection is provided from metal layer 3 portion 545A (not a part of standard cell 500A, but present/provided in a chip that uses standard cell 500A) to metal layer 2 portion 520A through via 570A. It may be appreciated that such connection is provided at the chip level design stage.

Power connection is provided from metal layer 2 portion 520A to metal layer 1 (portions 530A, 535A, 551A, 561A) through vias 555A and 565A. It may be appreciated that for the example standard cell 500A, such connection is already present at the cell level, and need not be provided at chip level. Power connection from metal layer 1 to portions 550A and 560A is provided through contacts 554A and 564A respectively.

Standard cell 500B represents a library component obtained from standard cell 500A in a manner described above. Portions 550B, 560B, 551B, 552B, 561B, 562B, 554B, 553B, 564B and 563B in standard cell 500B correspond respectively to portions 550A, 560A, 551A, 552A, 561A, 562A, 554A, 553A, 564A and 563A in standard cell 500A. Portion 530B corresponds to portions 530A and 535A. It may be observed from FIG. 5B that metal layer 2 (portions 510A and 520A in standard cell 500A) have been removed. It is noted that both metal layer 3 portions 540B and 545B and metal layer 2 portion 580B are not part of standard cell 500B, but present/provided in a chip that uses standard cell 500B.

It may be observed that components of standard cell 500B (e.g., portions 550B and 560B) may now need to be provided power connections at the chip level, due to the removal of metal layer 2 in standard cell 500B. The manner in which such power connection is provided is noted next.

Power connection is provided from metal layer 3 portions 540B and 545B to metal layer 2 portion 580B through respective vias 596B and 595B. It may be appreciated that such connection is provided at the chip level design stage. Similarly, power connection is provided from metal layer 2 portion 580B to metal layer 1 (portions 530B, 551B, 561B) through vias 590B and 591B, also at chip level.

Power connection from metal layer 1 to portions 550B and 560B is provided through contacts 554B and 564B respectively (i.e., such connection already exists at the cell level).

Thus, it may be appreciated that reconnections may be provided when the modified standard cells are used at the chip (integrated circuit) level. The manner in which such reconnections may be specified while integrating modified standard cells such as cell 500B may be performed in a known way. As an example, such reconnections may need to be specified in a top-level design file (design/connection description) used to design a chip (IC) that uses such modified standard cells.

A corresponding electronic design automation (EDA) tool may then be provided with such a connection description to ensure that the reconnections are made. The specific layer from which to provide each removed constant bias connections may be based on balancing of various constraints (routing, proximity, number of available layers, etc.), as will be apparent to one skilled in the relevant arts.

To further illustrate, a physical place-and-route (P&R) EDA tool (for e.g., MAGMA) may be designed to perform power/ground placement and routing in a corresponding specific manner, generally termed as power routing steps. An engineer/operator specifies the corresponding steps (typically in the form of text specifying) in a file, which is provided as an input to the P&R tool. The text in the input file contains information/instructions specifying which metal layers are to be used for power/ground routing, as well as connections (termed straps) from the corresponding power/ground layer(s) to component nodes which require power/ground connections.

Thus, with respect to the example structure of FIG. 5A in which the standard cells are source/unmodified standard cells, the input file specifies the power/ground layer to be metal 2 layer 520A. Accordingly, the P&R tool then lays power/ground in metal 2 layer.

When modified standard cells are to be used (with power/ground only in metal layer 1, as depicted with respect to FIG. 5B), the engineer/operator may add/delete/edit text in the input file (noted above) to specify that power/ground connection are to be provided from metal layer 1. Accordingly, the P&R tool creates a power grid starting from the lowest level (metal layer 1, i.e., portion 530B in the case of FIG. 5B, as against metal layer 2 (portion 520A) in the case of FIG. 5A. The P&R tool provides power connection from metal layer 1 (portions 530B, 551B, 561B) to metal layer 2 portion 580B through vias 590B and 591B. Metal layer 2 portion (added at chip level) 580B may be specified in the input file.

The P&R tool then provides power connection from metal layer 3 portions 540B and 545B to metal layer 2 portion 580B through respective vias 596B and 595B. As further illustration, two example power/ground grid layouts are briefly described next with respect to FIGS. 6A and 6B.

Figure 6A:
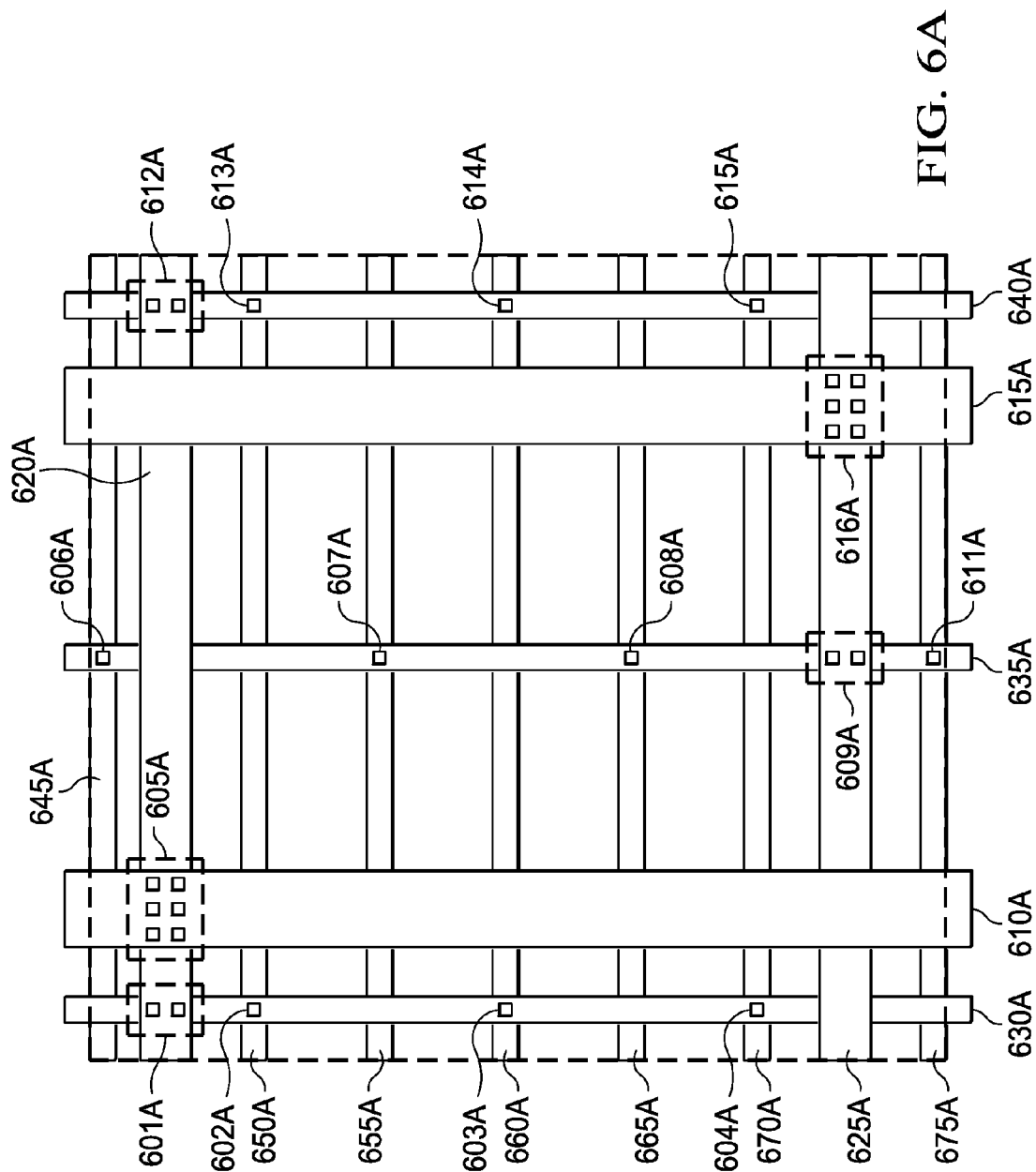
FIGS. 6A and 6B respectively are diagrams illustrating power/ground grids in a portion of an IC using a source standard cell and a modified standard cell in an embodiment of the present invention.

FIG. 6A illustrates the layout of power/ground grid in a portion of an IC that uses source (unmodified) standard cells designed to receive power/ground connections provided via metal layer 2. In the grid shown in FIG. 6A, portions 610A and 615A are metal 5 layers, and receive power/ground from an external source via corresponding power/ground connections (e.g., pins) on the IC. Portions 620A and 625A are metal 4 layers, and receive power and ground connections from metal 5 layers through via-connections 605A and 616A respectively. In FIG. 6A, each of 605A and 616A is shown as containing multiple (six) vias.

Portions 630A, 635A and 640A are metal 3 layers, and receive power and ground connections from metal 4 layers through via-connections 601A/612A (for power) and 609A (for ground). In FIG. 6A, each of via connections 601A, 611A and 612A is shown as containing multiple (two) vias). Portions 645A, 650A, 655A, 660A, 665A, 670A and 675A are metal 2 layers, and receive power and ground connections from metal 3 layers through vias 602A/603A/604A/613A/614A/615A (for power) and 606A/607A/608A/611A (for ground).

It may be appreciated that a standard cell designed to contain power/ground connections on both metal layer 2 and metal layer 1 (for example standard cell 500A of FIG. 5A) may be provided power/ground connections from metal layer 2, and thence to metal layer 1 and components contained within the standard cell.

Figure 6B:
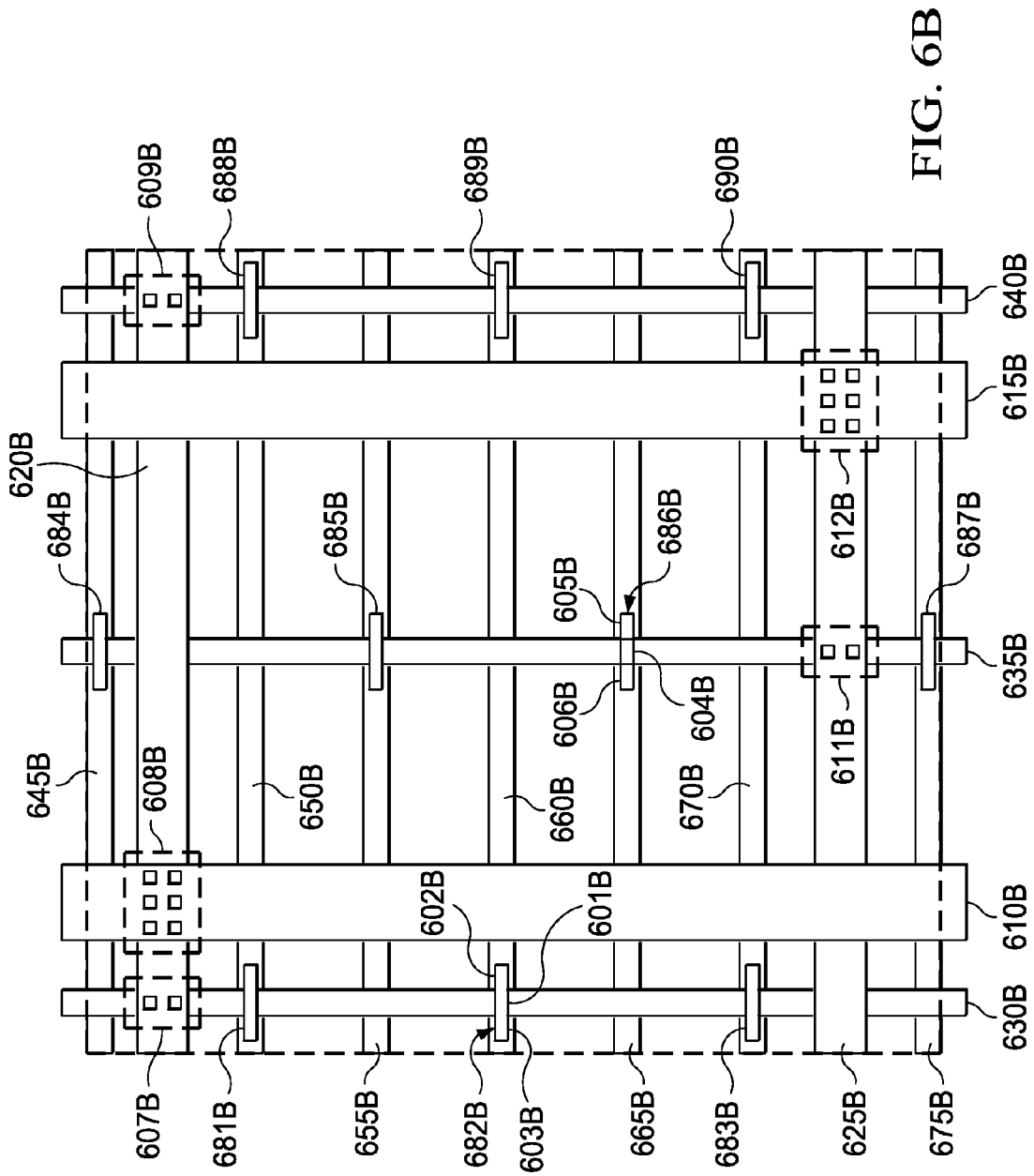

FIG. 6B illustrates the layout of power/ground grid in a portion of an IC that uses modified standard cells designed to receive power/ground connections provided via metal layer 1 (with metal layer 2 having been removed, as described above). In the grid shown in FIG. 6B, portions 610B and 615B are metal 5 layers, and receive power/ground from an external source via corresponding power/ground connections (e.g., pins) on the IC. Portions 620B and 625B are metal 4 layers, and receive power and ground connections from metal 5 layers through via-connections 608B and 612B respectively. In FIG. 6B, each of 608B and 612B is shown as containing multiple (six) vias.

Portions 630A, 635A and 640A are metal 3 layers, and receive power and ground connections from metal 4 layers through via-connections 607B/609B (for power) and 611B (for ground). In FIG. 6B, each of connections 607B, 609B and 611B is shown as containing multiple (two) vias. Portions 645B, 650B, 655B, 660B, 665B, 670B and 675B are metal 1 layers. It may be observed by a comparison of FIGS. 6A and 6B that the metal 2 layer portions of FIG. 6A have been moved to metal layer 1 in FIG. 6B. As noted above, such a change may be accomplished by specifying using corresponding text in an input file provided to a P&R tool.

Continuing again with reference to FIG. 6B metal 2 layer portions (stubs) 681B through 690B have been added, and receive power/ground connections from metal 3 layer through corresponding vias. For example, metal 2 layer portion 682B is shown as receiving power connection from metal 3 layer portion 630B through via 601B. Similarly, metal 2 layer portions 681B, 683B, 688B, 689B and 690B also receive power connections from corresponding metal 3 layer portions through corresponding vias not numbered, but shown in FIG. 6B. Metal 2 layer portion 686B is shown as receiving ground connection from metal 3 layer portion 635B through via 604B. The other metal 2 layer portions 684B, 685B and 687B also receive ground connections through corresponding vias.

Metal layer 1 portions (noted above) receive power and ground connections from metal 2 layer portions through corresponding vias. For example, metal layer 1 portion 660B is shown as receiving power connection from metal layer 2 portion 682B through vias 602B and 603B. Metal layer 1 portion 665B is shown as receiving ground connections from metal layer 2 portion 686B through vias 605B and 606B.

A modified standard cell designed to contain power/ground connections only on metal layer 1 (for example standard cell 500B of FIG. 5B) is provided power/ground connections through metal layer 1. Thus, an engineer/operator needs to specify in the input file to the P&R tool to provide/create metal layer 2 stubs (note with respect to FIG. 6B), as well as the corresponding vias to connect power/ground from the metal 2 stubs to metal 1 layer. The P&R tool may then provide the routed schematic, including the connections from the previously disconnected nodes in the standard cell (to power and ground).

The description is continued with an illustration of the operational flow related to the generation of libraries containing source and modified standard cells described above.

7. Operations Flow

Figure 7:
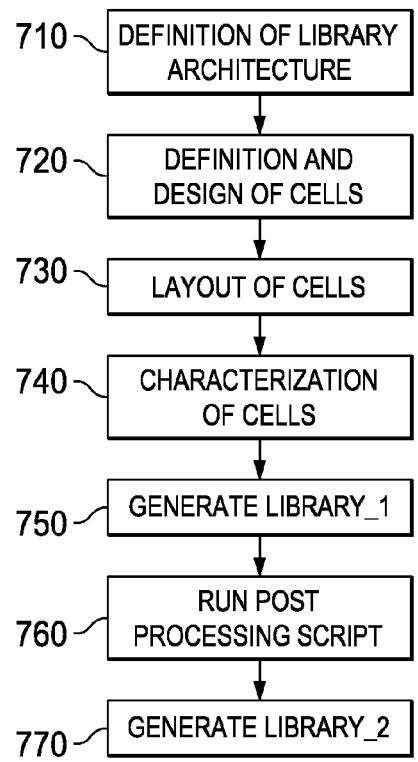
FIG. 7 is a flow diagram illustrating an example context in which the conversion of the present invention can be used.

FIG. 7 is a flow diagram illustrating an example scenario in which the approaches described above may be employed. In step 710, the architecture of a library is defined. Library architecture generally refers to a set of rules to be followed for layout of a standard cell, and typically specifies the cell height, track pitch (to determine spacing between two metal levels), power bus layer, power bus placement, boundary snapping rule etc. In general, the definition entails specifying the specific cell types to be included and various criteria to be met for each of the cell types.

In step 720, standard cells are designed. The design may involve generation of circuit schematics of the corresponding circuits using CAD tools (as illustrated with respect to FIG. 1), and simulation/verification of the circuits corresponding to the standard cells.

In step 730, physical layout (on a plane representing a semiconductor) of the circuits obtained in step 720 is performed. In step 740, characterization of the laid-out circuits is performed, in which it is determined if the performance parameters (e.g., power consumptions, propagation delay, etc.) of the circuits comply with desired values.

In step 750, corresponding to each laid-out and verified circuit (for a cell type), a component is created and stored in a library (Library_1). The components created in Library_1 may contain power and ground buses in multiple layers (e.g., cells 200 and 250 of FIGS. 2A and 2B respectively and cell 500A of FIG. 5A, which contain power and ground buses in metal layer 1 as well as metal layer 2).

In step 760, a post-processing script is executed on each component stored in Library_1 in a manner described above with respect to the flowchart of FIG. 3, to generate (step 770) a second library (Library_2), in which the components have more routing resources on at least one metal layer.

Such a feature may be used, for example, when the integrated circuit (sought to be designed) has closely clustered cells, with dense routing requirements. As the conversion to new cells merely requires execution of appropriate software instructions consistent with the description above, the conversion can be simplified. The description is continued with an example set of software instructions implementing at least some of the features described above.

8. Example Software Instructions

In an embodiment of the present invention, the cell description is in the form of a LAFF file, and the post processing script is implemented in LV (a Perl-type language) LV, as shown below with appropriate comments.

```
LAYERS
'********** Basic process layers - following section of the code defines basic process layers **********'
    NWELL, SNL = NWELSIGS
    ACTIVE, SNL = ACTIVESIGS, IOSNL = ACTIVESGN
    ACTIVE_GRD =ACTIVE,purpose=guard_ring
    TAP
    POLY, SNL = POLYSIGS, IOSNL = POLYSGN
    CONT
    MET1, SNL = MET1SIGS, IOSNL = MET1SGN
    VIA1
    MET2, SNL = MET2SIGS, IOSNL = MET2SGN
    VIA2
    MET3, SNL = MET3SIGS, IOSNL = MET3SGN
    VIA3
    MET4
    VIA4
    MET5
    VIA5
    MET6
    GHOSTPOLY
'****** Signal name/port layers - following section defined signal layer*****'
    ACTIVEPN, SNL=ACTIVESIGS
    POLYPN, SNL=POLYSIGS, IOSNL=POLYPORTSG
    MET1PN, SNL=MET1SIGS, IOSNL=M1PORTSG
    MET2PN, SNL=MET2SIGS, IOSNL=M2PORTSG
    MET3PN, SNL=MET3SIGS, IOSNL=M3PORTSG
    MET4PN, SNL=MET4SIGS, IOSNL=M4PORTSG
    MET5PN, SNL=MET5SIGS, IOSNL=M5PORTSG
    MET6PN, SNL=MET6SIGS, IOSNL=M6PORTSG
'**** Asic layout layers ******'
    BOUNDARY
    GRID
    MET1_OBS =MET1,purpose=obs
    MET2_OBS =MET2,purpose=obs
    MET3_OBS =MET3,purpose=obs
    MET4_OBS =MET4,purpose=obs
    MET5_OBS =MET5,purpose=obs
    RES
    SITEBND, SNL = SITESIGS
    TRACKS
'**** Old layer names are illegal *****'
    NDIFF
    PDIFF
'**** Compat with CDS *********'
    OBS1
    OBS2
    OBS3
    OBS4
    OBS5
'**** TGOX18LV layer *********'
    TGOX18LV
'**** HIGHVT Layer *********'
    HIGHVT     'For high Vt transistors
'**** LOWVT Layer *********'
    LOWVT      'For low Vt transistors
END
EXTRACTS
'########### Compatable with old layer names #############
    MET1_OBS = MET1_OBS + OBS1
    MET2_OBS = MET2_OBS + OBS2
    MET3_OBS = MET3_OBS + OBS3
    MET4_OBS = MET4_OBS + OBS4
    MET5_OBS = MET5_OBS + OBS5
    TOPIOMET1 = M1PORTSG include names "USE_CELL_TO_PROCESS"
    TOPIOMET2 = M2PORTSG include names "USE_CELL_TO_PROCESS"
    TOPIOMET3 = M3PORTSG include names "USE_CELL_TO_PROCESS"
    TOPIOMET4 = M4PORTSG include names "USE_CELL_TO_PROCESS"
```

```
    TOPIOMET5 = M5PORTSG include names "USE_CELL_TO_PROCESS"
    TOPIOMET6 = M6PORTSG include names "USE_CELL_TO_PROCESS"
    TOPSIGMET1 = MET1SIGS include names "USE_CELL_TO_PROCESS"
    TOPSIGMET2 = MET2SIGS include names "USE_CELL_TO_PROCESS"
    TOPSIGMET3 = MET3SIGS include names "USE_CELL_TO_PROCESS"
    TOPSIGMET4 = MET4SIGS include names "USE_CELL_TO_PROCESS"
    TOPSIGMET5 = MET5SIGS include names "USE_CELL_TO_PROCESS"
    TOPSIGMET6 = MET6SIGS include names "USE_CELL_TO_PROCESS"
EXTRACTS
#boundary=comination of boundary and sitebnd
CIRCUIT INTERCONNECT
    TOPIOMET1 CONNECTS TO MET1
    TOPIOMET2 CONNECTS TO MET2
    TOPIOMET3 CONNECTS TO MET3
    TOPIOMET4 CONNECTS TO MET4
    TOPIOMET5 CONNECTS TO MET5
    TOPIOMET6 CONNECTS TO MET6
    TOPSIGMET1 CONNECTS TO MET1
    TOPSIGMET2 CONNECTS TO MET2
    TOPSIGMET3 CONNECTS TO MET3
    TOPSIGMET4 CONNECTS TO MET4
    TOPSIGMET5 CONNECTS TO MET5
    TOPSIGMET6 CONNECTS TO MET6
    MET2    CONNECTS TO MET1 VIA VIA1
    MET3    CONNECTS TO MET2 VIA VIA2
    MET4    CONNECTS TO MET3 VIA VIA3
    MET5    CONNECTS TO MET4 VIA VIA4
    MET6    CONNECTS TO MET5 VIA VIA5
END
'****** Following section defines various layers to be extracted - Please check MET2PN_PWR and MET2_PWR are two extract definition which is
specific to Met2 Power bus to be removed. These two layers are not part of output layer and it means it will not be dumped out. Also Met2 definition has
been modified in order to ensure that it does not cover power bus level Met2*****'
EXTRACTS
    M1PORT    = CIRCUIT NODES OF MET1
    M2PORT    = CIRCUIT NODES OF MET2
    M3PORT    = CIRCUIT NODES OF MET3
    M4PORT    = CIRCUIT NODES OF MET4
    M5PORT    = CIRCUIT NODES OF MET5
    M6PORT    = CIRCUIT NODES OF MET6
    M1PORT    = M1PORT having circuit names
    M2PORT    = M2PORT having circuit names
    M3PORT    = M3PORT having circuit names
    M4PORT    = M4PORT having circuit names
    M5PORT    = M5PORT having circuit names
    M6PORT    = M6PORT having circuit names
# MET1PN    = MET1 touching MET1PN
# MET2PN    = MET2 touching MET1PN
# MET3PN    = MET3 touching MET1PN
# MET4PN    = MET4 touching MET1PN
# MET5PN    = MET5 touching MET1PN
    MET1PN    = MET1PN with signal names from M1PORT
    MET2PN    = MET2PN with signal names from M2PORT
    MET3PN    = MET2PN with signal names from M3PORT
    MET4PN    = MET2PN with signal names from M4PORT
    MET5PN    = MET2PN with signal names from M5PORT
    TEXT      = TEXT contained by BOUNDARY
    MET2PN_PWR  = MET2PN having signal names VDD or VSS or VDDC or VBBNW or VBBPW or vdd or vss or vddc or vbbnw or vbbpw
    MET2_PWR   = MET2 touching MET2PN_PWR
    MET2       = MET2 not touching MET2_PWR
    MET2PN     = MET2PN not touching MET2PN_PWR
    MET2PN     = MET2PN with signal names from M2PORT
    MET1PN     = copy of M1PORT
    MET1PN     = MET1PN with signal names from M1PORT
    BOUNDARY_BIG   = BOUNDARY size rectangles by " 0.000, 0.070 "
    BOUNDARY_SMALL = BOUNDARY size rectangles by " 0.000, -0.070 "
    BOUND_MET1 = BOUNDARY_BIG not common to BOUNDARY_SMALL
    MET1       = MET1 + BOUND_MET1
####### Do not output MET2PN_PWR / MET2_PWR layers###############
OUTPUT LAYERS
#BOUNDARY_BIG
#BOUNDARY_SMALL
#M1PORT
#M2PORT
#MET2PN_PWR
#MET2PWR
#MET2_NONPWR
CONT    , REPLACE
```

```
MET1PN     , REPLACE
MET2PN     , REPLACE
#MET3PN    , REPLACE
#MET4PN    , REPLACE
#MET5PN    , REPLACE
#MET6PN    , REPLACE
#METTOPPN  , REPLACE
MET1    , REPLACE, CLEANUP
MET2    , REPLACE, CLEANUP
MET3    , REPLACE, CLEANUP
MET4    , REPLACE, CLEANUP
MET5    , REPLACE, CLEANUP
MET6    , REPLACE, CLEANUP
METTOP  , REPLACE, CLEANUP
VIA1    , REPLACE, CLEANUP, DELETE SIGNAL NAMES
VIA2    , REPLACE, CLEANUP, DELETE SIGNAL NAMES
VIA3    , REPLACE, CLEANUP, DELETE SIGNAL NAMES
VIA4    , REPLACE, CLEANUP, DELETE SIGNAL NAMES
VIA5    , REPLACE, CLEANUP, DELETE SIGNAL NAMES
VIATOP  , REPLACE, CLEANUP, DELETE SIGNAL NAMES
BOUNDARY, REPLACE, CLEANUP, DELETE SIGNAL NAMES
POLY
ACTIVE
TEXT
GHOSTPOLY
MET1_OBS
MET2_OBS
MET3_OBS
#M1PORT
#M2PORT
#M3PORT
END OUTPUT LAYERS
```

It should be understood that each feature of the present invention can be implemented in a combination of one or more of hardware, software and firmware. An example embodiment implemented substantially in software is described next.

9. Software Implementation

Figure 8:
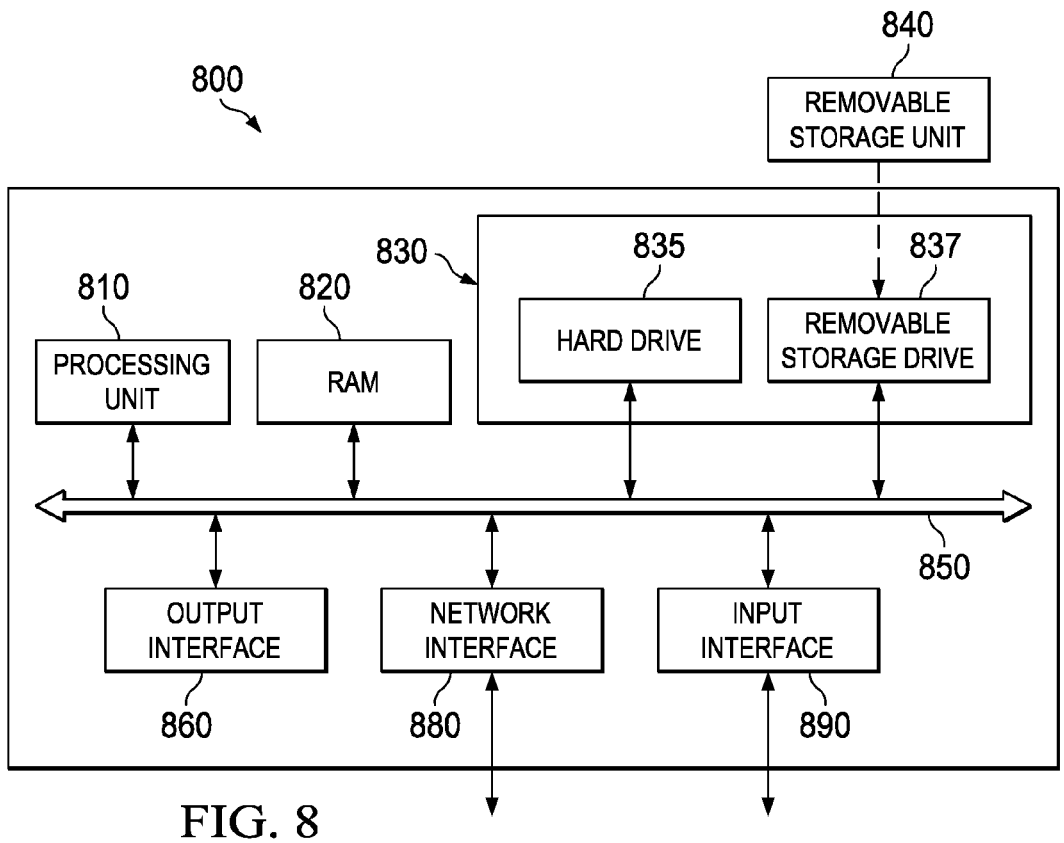
FIG. 8 is a block diagram illustrating the details of an embodiment of a system in which several aspects of the present invention may be implemented.

FIG. 8 is a block diagram illustrating the details of a system 800 in one embodiment, in which several aspects of the present invention may be implemented. System 800 may correspond, for example, to a desk-top computer or a workstation that may be used to execute CAD/EDA tools enabling a designer/user to design an IC. In addition, system 800 may also be used to generate standard cell library components as described above. System 800 is shown containing processing unit 810, random access memory (RAM) 820, storage 830, output interface 860, network interface 880, and input interface 890. Each component is described in further detail below.

Output interface 860 provides output signals (e.g., display signals to a display unit (not shown) to generate visual interface 100 of FIG. 1) which can form the basis for a suitable user interface for a user to interact with system 800. Input interface 890 (e.g., interface with a key-board and/or mouse, not shown) enables a user to provide any necessary inputs (e.g. creation of a schematic, running commands to simulate, verify designs, convert to new cells, etc.) to system 800.

Network interface 880 enables system 800 to send and receive data (for example to store or retrieve libraries/components) via communication networks using asynchronous transfer mode (ATM) and any other protocols (e.g., SS7, PNNI, well known in the relevant arts) system 800 may be using. Network interface 880, output interface 860 and input interface 890 can be implemented in a known way.

RAM 820 and storage 830 may together be referred to as a memory. RAM 820 receives instructions and data on path 850 from storage 830, and provides the instructions to processing unit 810 for execution. Storage 830 may contain units such as hard drive 835 and removable storage drive 837. Storage 830 may store the software instructions and data, which enable system 800 to provide several features in accordance with the present invention. In particular, RAM 820 and storage 830 may store library 170 (FIG. 1), as well as a post processing script to generate components as described above.

Some or all of the data and instructions may be provided on removable storage unit 840, and the data and instructions may be read and provided by removable storage drive 837 to processing unit 810 via RAM 820. Floppy drive, magnetic tape drive, CD-ROM drive, DVD Drive, Flash memory, removable memory chip (PCMCIA Card, EPROM) are examples of such removable storage drive 837.

Processing unit 810 may contain one or more processors. Some of the processors can be general purpose processors which execute instructions provided from RAM 820. Some can be special purpose processors adapted for specific tasks. The special purpose processors may also be provided instructions from RAM 820. In general processing unit 810 reads sequences of instructions (including instruction in a post processing script as noted above) from various types of memory medium (including RAM 820, storage 830 and removable storage unit 840), and executes the instructions to provide various features of the present invention. The memory medium can be viewed as a computer readable storage medium.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. A method of designing an integrated circuit, the method comprising:
    examining, using a computer, a first cell description of a source cell to identify a power bus, the power bus having at least two or more metal layers and wherein the power bus is connected to at least one node of the source cell, wherein the cell description of the source cell represents a physical layout of the source cell;
    forming a second cell description of the source cell from the first cell description of the source cell by removing a first metal layer from the at least two or more metal layers using a computer; and
    connecting the power bus in the second cell description to the at least one node using any metal layer from the at least two or more metal layers except the first metal layer when the second cell description of the source is incorporated in the integrated circuit using a computer.

2. The method of claim 1, wherein the forming also comprises removing at least one or more vias connecting the at least one node to the power bus.

3. The method of claim 1, wherein the first cell description is contained in a first library, the method further comprising:
    receiving the first cell description from the first library; and
    storing the second cell description in a second library.

4. The method of claim 1, wherein the second cell description is used in designing the integrated circuit having a more dense routing requirements compared to another integrated circuit designed using the first library.

5. The method of claim 1, wherein the power bus is held at a DC voltage.

6. The method of claim 1, wherein the power bus is held at ground.

7. A computer readable non-transitory medium storing one or more sequences of instructions causing a system to enable design of an integrated circuit, wherein execution of the one or more sequences of instructions by one or more processors contained in the system causes the system to perform the actions of:
    examining a first cell description of a source cell to identify a power bus, the power bus having at least two or more metal layers and wherein the power bus is connected to at least one node of the source cell, wherein the cell description of the source cell represents a physical layout of the source cell;
    forming a second cell description of the source cell from the first cell description of the source cell by removing a first metal layer from the at least two or more metal layers; and
    connecting the power bus in the second cell description to the at least one node using any metal layer from the at least two or more metal layers except the first metal layer when the second cell description of the source is incorporated in the integrated circuit.

8. The computer readable non-transitory medium of claim 7, wherein the forming also comprises removing at least one or more vias connecting the at least one node to the power bus.

9. The computer readable non-transitory medium of claim 7, wherein the first cell description is contained in a first library, the computer readable medium further comprising:
    receiving the first cell description from the first library; and
    storing the second cell description in a second library.

10. The computer readable non-transitory medium of claim 7, wherein the second cell description is used in designing the integrated circuit having a more dense routing requirements compared to another integrated circuit designed using the first library.

11. The computer readable non-transitory medium of claim 7, wherein the power bus is held at a DC voltage.

12. The computer readable non-transitory medium of claim 7, wherein the power bus is held at ground.

* * * * *